US011222824B2

United States Patent
Bruel

(10) Patent No.: US 11,222,824 B2
(45) Date of Patent: Jan. 11, 2022

(54) METHOD FOR TRANSFERRING A LAYER BY USING A DETACHABLE STRUCTURE

(71) Applicant: Soitec, Bernin (FR)

(72) Inventor: Michel Bruel, Veurey-voroize (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 16/769,976

(22) PCT Filed: Nov. 21, 2018

(86) PCT No.: PCT/FR2018/052939
§ 371 (c)(1),
(2) Date: Jun. 4, 2020

(87) PCT Pub. No.: WO2019/110886
PCT Pub. Date: Jun. 13, 2019

(65) Prior Publication Data
US 2020/0388539 A1 Dec. 10, 2020

(30) Foreign Application Priority Data
Dec. 7, 2017 (FR) ..................................... 1761759

(51) Int. Cl.
*H01L 21/78* (2006.01)
*H01L 21/304* (2006.01)

(52) U.S. Cl.
CPC ........ *H01L 21/7813* (2013.01); *H01L 21/304* (2013.01)

(58) Field of Classification Search
CPC ............................ H01L 21/7813; H01L 21/304
USPC ................................................. 438/458, 455
See application file for complete search history.

(56) References Cited

U.S. PATENT DOCUMENTS

| 7,951,691 B2 | 5/2011 | Burghartz et al. |
| 2006/0063352 A1* | 3/2006 | Barlocchi ......... H01L 21/76251 438/455 |
| 2011/0215295 A1* | 9/2011 | Lugauer ................. H01L 33/22 257/13 |

(Continued)

FOREIGN PATENT DOCUMENTS

WO 2011/131847 A1 10/2011

OTHER PUBLICATIONS

International Search Report for International Application No. PCT/FR2018/052939 dated Mar. 1, 2019, 2 pages.

(Continued)

*Primary Examiner* — David Vu
*Assistant Examiner* — Brandon C Fox
(74) *Attorney, Agent, or Firm* — TraskBritt

(57) ABSTRACT

A method for transferring a superficial layer from a detachable structure comprises the following steps: a) supplying the detachable structure comprising: •a support substrate, •a detachable layer arranged on the support substrate along a main plane and comprising a plurality of walls that are separated from one another, each wall having at least one side that is perpendicular to the main plane; •a superficial layer arranged on the detachable layer along the main plane; b) applying a mechanical force configured to cause said walls to bend, along a direction that is secant to said side, until causing the mechanical rupture of the walls, in order to detach the superficial layer from the support substrate.

18 Claims, 9 Drawing Sheets

(56) References Cited

U.S. PATENT DOCUMENTS

| | | | | |
|---|---|---|---|---|
| 2011/0294281 A1* | 12/2011 | Zang | ................... | H01L 21/0254 |
| | | | | 438/478 |
| 2015/0069418 A1* | 3/2015 | Heo | .................. | H01L 21/02664 |
| | | | | 257/79 |
| 2016/0307792 A1* | 10/2016 | Werner | ............. | H01L 21/02529 |
| 2017/0005224 A1 | 1/2017 | Shur et al. | | |

OTHER PUBLICATIONS

International Written Opinion for International Application No. PCT/FR2018/052939 dated Mar. 1, 2019, 6 pages.

* cited by examiner

METHOD FOR TRANSFERRING A LAYER BY USING A DETACHABLE STRUCTURE

CROSS-REFERENCE TO RELATED APPLICATIONS

This application is a national phase entry under 35 U.S.C. § 371 of International Patent Application PCT/FR2018/052939, filed Nov. 21, 2018, designating the United States of America and published as International Patent Publication WO 2019/110886 A1 on Jun. 13, 2019, which claims the benefit under Article 8 of the Patent Cooperation Treaty to French Patent Application Serial No. 1761759, filed Dec. 7, 2017.

TECHNICAL FIELD

The present disclosure relates to the field of transferring thin layers for applications in microelectronics, optics, microsystems, etc. In particular, it relates to a detachable structure that can be used for transferring or handling thin layers.

BACKGROUND

Many applications, particularly in the fields of microelectronics, optics or microsystems, require thin layers (potentially integrating components) arranged on specific substrates (thin, flexible, metallic, insulators, etc.). These specific substrates are not always compatible with the methods for manufacturing thin layers and/or the methods for integrating components on the layers.

It is therefore valuable to be able to transfer a thin layer (with or without integrated components) from an original substrate compatible with the above-mentioned methods to a specific target substrate having the properties required for the intended application.

There are several methods for transferring a thin layer developed on an original substrate onto a target substrate.

Some transfer methods consist of assembling the thin layer (arranged on the original substrate) and the target substrate, and then mechanically and/or chemically removing the original substrate, thus transferring the thin layer onto the target substrate. The main drawbacks of this approach are the costs associated with the loss of the original substrate and the restrictive mechanical and chemical treatments that can degrade the quality of the thin layer during the transfer.

Other methods are based on detachment, by applying mechanical stress or a chemical treatment to a weakened layer or interface present in the original substrate between the thin layer and the original substrate; the thin layer previously assembled on the target substrate is transferred onto the target substrate when detachment takes place. This is notably the case of the methods described in documents FR2748851, FR2823599 or FR2823596.

The disadvantages of these approaches are substantially due to the fact that the steps of detachment, by inserting a blade between the assembled original and target substrates, by applying high tensile stresses, and/or by immersion in a chemical solution, are capable of degrading the quality of the thin layer. Furthermore, the detachment can sometimes occur at interfaces or layers other than the weakened one because it is difficult to localize the mechanical stress and/or chemical attack precisely at the weakened layer or interface.

Still other processes, based on laser separation at an interface ("laser lift-off"), require the use of a transparent substrate (for the final substrate or for the original support substrate), which limits the scope of application.

BRIEF SUMMARY

The present disclosure relates to an alternative solution aimed at solving all or part of the disadvantages of the prior art. One object of the present disclosure is a structure detachable at a detachable layer, which can be used for transferring or handling layers.

The present disclosure relates to a method for transferring a superficial layer from a detachable structure comprising the following steps:

a) Supplying the detachable structure comprising:
   a support substrate,
   a detachable layer arranged on the support substrate along a main plane and comprising a plurality of walls that are separated from one another, each wall having at least one side perpendicular to the main plane;
   a superficial layer arranged on the detachable layer along the main plane;

b) Applying a mechanical force configured to cause the walls to bend, along a direction that is secant to the side, until causing the mechanical rupture of the walls, in order to detach the superficial layer from the support substrate.

According to advantageous features of the invention, taken alone or in any feasible combination:

the walls are distributed in the main plane according to a predefined grid;
the predefined grid of walls is such that there is at least one transverse direction in the main plane forming a non-zero angle with one side of each wall;
each wall comprises two longitudinal sides defined by a length and a height of the wall, and two transverse sides defined by a width and the height of the wall, the longitudinal and transverse sides being perpendicular to the main plane;
the length of each wall is greater than the width of each wall, and the transverse direction forms a non-zero angle with a longitudinal side of each wall;
the mechanical force of step b) is a shearing force applied to the detachable layer along the transverse direction;
the shearing force is applied by means of a roller, advancing gradually over the detachable structure, in the main plane and along the transverse direction, with a specific pressing force;
the mechanical force of step b) is a shock applied to the detachable structure, along the transverse direction;
the mechanical force of step b) is a vibrating wave applied to the detachable structure, along the transverse direction, and capable of making the walls oscillate;
each wall has a width, in the main plane, of between 0.1 and 10 microns;
the width of each wall at the lower part in the vicinity of the support substrate is smaller than the width of each wall at the upper part in the vicinity of the superficial layer;
the walls have a height, perpendicular to the main plane, of between 0.5 and 5 microns;
each wall has a width in the main plane and a height perpendicular to the main plane, and the height-to-width ratio is greater than 1, preferably greater than 5;
the detachable layer of the detachable structure supplied in step a) is formed by local etching of a layer of silicon oxide arranged on the support substrate;

the detachable layer of the detachable structure supplied in step a) is formed by local etching of the support substrate;

the support substrate is made of silicon;

step a) comprises transferring the superficial layer onto the detachable layer by assembly of a donor substrate on the detachable layer and by thinning the donor substrate in order to form the superficial layer;

step a) comprises the production of microelectronic components on the superficial layer;

the transfer method comprises, prior to step b), a step of cutting the superficial layer in order to delimit a plurality of local superficial layers to be transferred;

the transfer method comprises, prior to step b), a step a') comprising the assembly of the superficial layer on a target substrate;

the transfer method comprises, after detaching the superficial layer in step b), a step c) including the removal of detachable layer remainders in order to expose a detached face of the superficial layer;

step c) comprises carrying out microelectronic steps on the detached face of the superficial layer.

BRIEF DESCRIPTION OF THE DRAWINGS

Further features and advantages of the present disclosure will be clear from the detailed description, made in reference to the appended figures, wherein.

DETAILED DESCRIPTION

Figure 1:
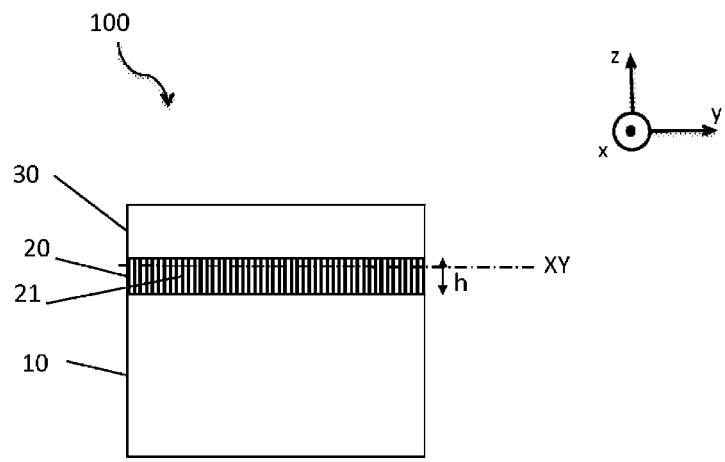
FIG. 1 shows a section view of a detachable structure in accordance with the invention.

In the description, the same references in the figures may be used for elements of the same type.

The figures are schematic depictions which, for the sake of readability, are not to scale. In particular, the thicknesses of the layers along the z-axis are not to scale relative to the lateral dimensions along the x-axis and the y-axis.

The present disclosure relates to a method for transferring a superficial layer 30 from a detachable structure 100.

The transfer method according to the present disclosure firstly comprises a step a) of supplying the detachable structure 100.

The detachable structure 100 comprises a support substrate 10. The latter can be chosen from materials compatible with microelectronic manufacturing processes (for example, silicon, silica, glass, etc.). Advantageously, it is formed from silicon, a material conventionally used in the semiconductor industry. The support substrate 10 can be in the form of a wafer with a diameter of 100 to 450 mm and a thickness of between 250 and 850 microns, for example.

The detachable structure 100 likewise comprises a detachable layer 20, arranged on the support substrate 10, along a main plane parallel to the plane (x, y) shown in FIG. 1; to simplify, the main plane will be referred to hereinafter as main plane (x, y).

The detachable layer 20 according to the present disclosure comprises a plurality of walls 21, distributed in the main plane (x, y), each wall 21 having at least one side perpendicular to the main plane.

Each wall 21 likewise has an "upper" surface, in contact directly or via an intermediate layer with the superficial layer 30, and a "lower" surface, in contact directly or via an intermediate layer with the support substrate 10. These lower and upper surfaces, parallel to the main plane (x, y), can have different shapes: for example, square (FIG. 2d), rectangular (FIGS. 2a, 2b, 2c), polygonal of any type (FIG. 2f), circular (FIG. 2e), elliptical (FIG. 2e), curved (FIG. 2e), etc. The examples of walls 21 depicted in FIGS. 2a to 2f are top views along the section plane XY noted in FIG. 1.

Depending on the shape of the lower and upper surfaces thereof, each wall 21 has one side or several sides. In the specific case of a wall 21 having circular lower and upper surfaces, the wall 21 forms a cylinder, the only side of the wall is thus the cylindrical surface perpendicular to the main plane (x, y). A wall 21 having elliptical lower and upper surfaces comprises two sides along the largest dimension of the ellipse, which sides are referred to as longitudinal. Finally, most of the other walls 21 comprise four sides: two longitudinal sides defined by the length L and the height h of the wall, and two transverse sides defined by the width 1 and the height h of the wall 21. The length L and the width 1 of each wall 21 are parallel to the main plane (x, y), the height h extends along the z-axis, perpendicular to the main plane (x, y).

Note that the longitudinal sides of all the walls 21 are not necessarily coplanar, as depicted in FIGS. 2a to 2f.

By way of example, the length of a wall 21 can range from several tens of microns to several centimeters, the width can range from 0.1 microns to 10 microns, or even several tens of microns and the height will be between around 0.5 microns and 5 microns, or even greater than 5 microns. Advantageously, the height-to-width ratio of each wall 21 is greater than or equal to 1, or even greater than 5.

The walls 21 are spaced apart from one another, the ends thereof being separated from one another by spaces 2 (FIGS. 2a to 2f).

Advantageously, the walls 21 are distributed in the main plane (x, y) according to a predefined grid. By predefined, it is understood that the distribution of the walls 21, i.e., their shape, their arrangements relative to one another and the spacing therebetween, are not entirely random. The grid of walls 21 thus has a certain ordered nature.

Figure 3:
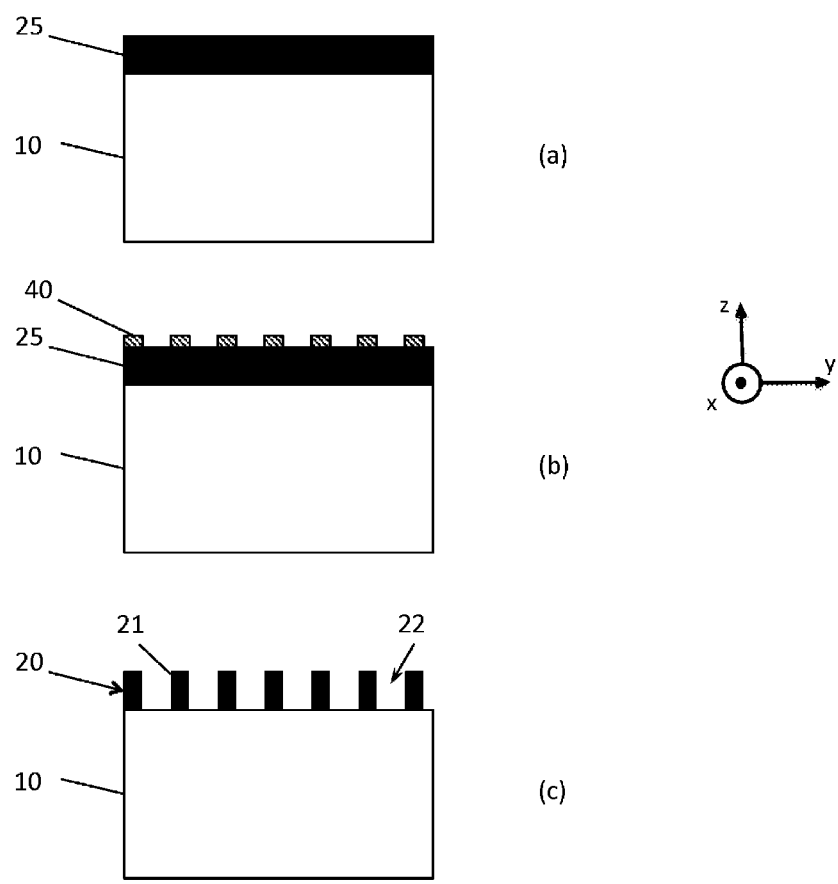
FIGS. 3 (a,b,c), 4 (a,b,c) and 5 (a,b,c) show steps of forming the detachable layer of a detachable structure in accordance with the invention.

According to a first option, the detachable layer 20 of the detachable structure 100 is formed by local etching of a layer 25 arranged on the support substrate 10 (FIG. 3). The layer 25 advantageously consists of silicon oxide. It is deposited on the support substrate 10 (FIG. 3a), either by thermal growth in the case of a silicon support substrate 10, or by chemical deposition (PECVD, LPCVD, etc.). A mask 40 arranged on the surface of the layer 25 of silicon oxide makes it possible to mask the zones where the walls 21 will be located (FIG. 3b). The non-masked zones are etched, by dry etching (for example, by plasma or Reactive Ion Etching (ME)) or wet etching (for example, by chemical etching based on hydrofluoric acid). After etching, the mask 40 is removed and the detachable layer 20 is formed (FIG. 3c), with walls 21 spaced apart (there are spaces 2 between the ends of the walls) and separated from one another by empty zones 22.

Figure 4:
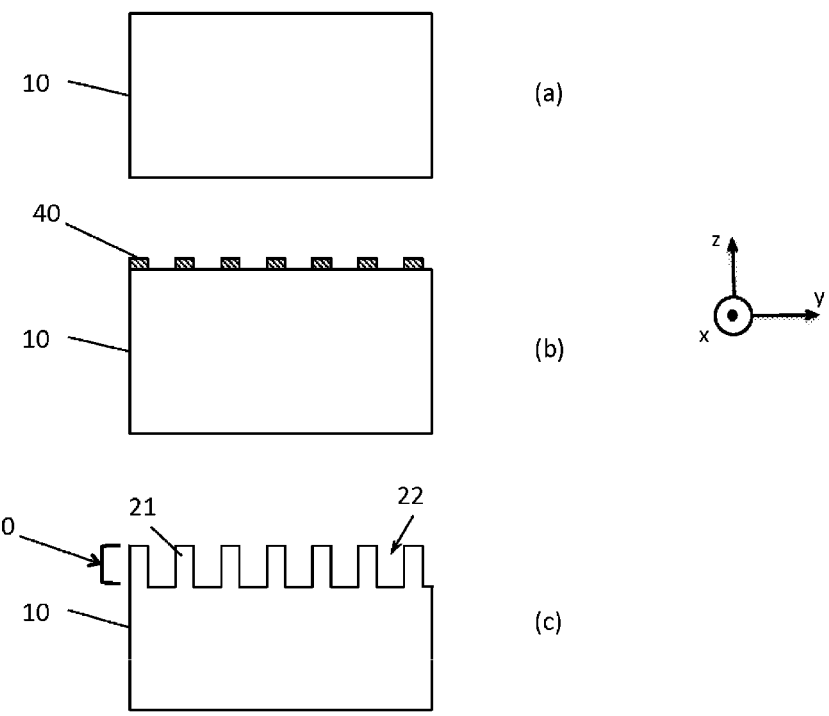

According to a second option, the detachable layer 20 of the detachable structure 100 supplied in step a) is formed by local etching of the support substrate 10 (FIG. 4). A mask 40, arranged on the surface of the support substrate 10, makes it possible to mask the zones where the walls 21 will be located (FIG. 4b). The non-masked zones are etched, by dry or wet etching. After etching, the mask 40 is removed and the detachable layer 20 is formed in the upper part of the support substrate 10 (FIG. 3c), with walls 21 spaced apart (there are spaces 2 between the ends of the walls) and separated from one another by empty zones 22.

According to a third option, the detachable layer 20 supplied in step a) has an asymmetrical shape according to its height: advantageously the width of the walls 21 at the lower part 212 is smaller than the width at the upper part 211.

Figure 5:
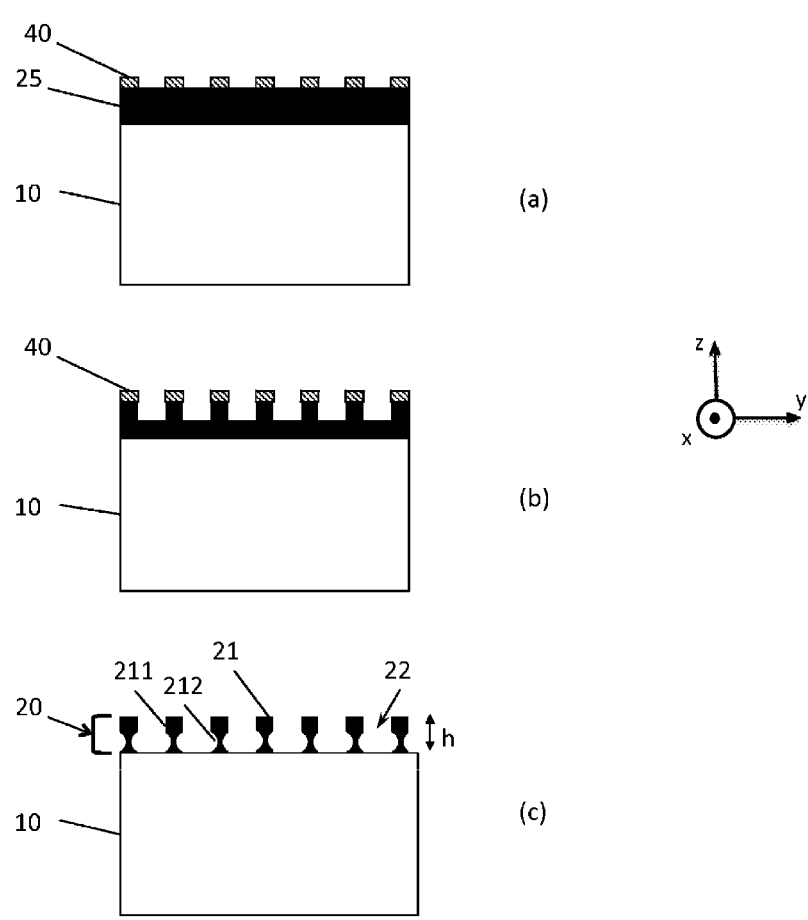

The detachable layer 20 may be formed by local etching either of a layer 25 arranged on the support substrate 10 (as depicted in FIG. 5), or of the support substrate 10 (not shown). A mask 40, arranged on the surface of the layer 25, makes it possible to mask the zones where the walls 21 will be located (FIG. 5a). The non-masked zones are etched over a first part of the thickness of the layer 25, by anisotropic etching (for example, by RIE) in order to generate straight sides of walls 21 at the upper part 211 (FIG. 5b). The non-masked areas are then etched isotropically (for example, by dry isotropic etching or wet HF etching), to form a narrowing at the lower part 212 of each wall 21. Advantageously, the lower part 212 of the walls 21 can be etched, without attacking the upper part 211, thanks to the use for anisotropic etching of a "polymerizing" RIE method, which passivates the sides of the etching and thus at least partially protects the upper part 211 from the isotropic HF etching. After these etching steps, the mask 40 is removed and the detachable layer 20 is formed (FIG. 5c), with asymmetrical walls 21, spaced apart (there are spaces 2 between the ends of the walls) and separated from one another by empty zones 22.

This asymmetrical shape of the walls 21 is advantageous in that it provides, due to its wider upper part 211, a larger assembly surface and therefore a more favorable mechanical support for the superficial layer 30, described below, arranged on the detachable layer 20. The asymmetrical shape of the walls 21 is likewise advantageous in that it promotes the detachment at the lower part 212 due to the narrowing; the detachment step will be described below.

The detachable structure 100 also comprises a superficial layer 30, arranged along the main plane (x, y) on the detachable layer 20 (FIG. 1).

The superficial layer 30, which is intended for being detached from the detachable structure 100, can have a thickness of between a few hundred nanometers and a few hundred microns, depending on the field of application. It can consist of a blank layer that consists of one material or a stack of materials, and/or a structured layer optionally comprising components. The material or materials that constitute the superficial layer 30 can be chosen from materials that are semiconductive (for example, silicon, germanium, SiGe, SiC, etc.), piezoelectric (for example, quartz, LiTaO$_3$, LiNbO$_3$, AlN, etc.), insulating, conductive, etc.

Figure 6:
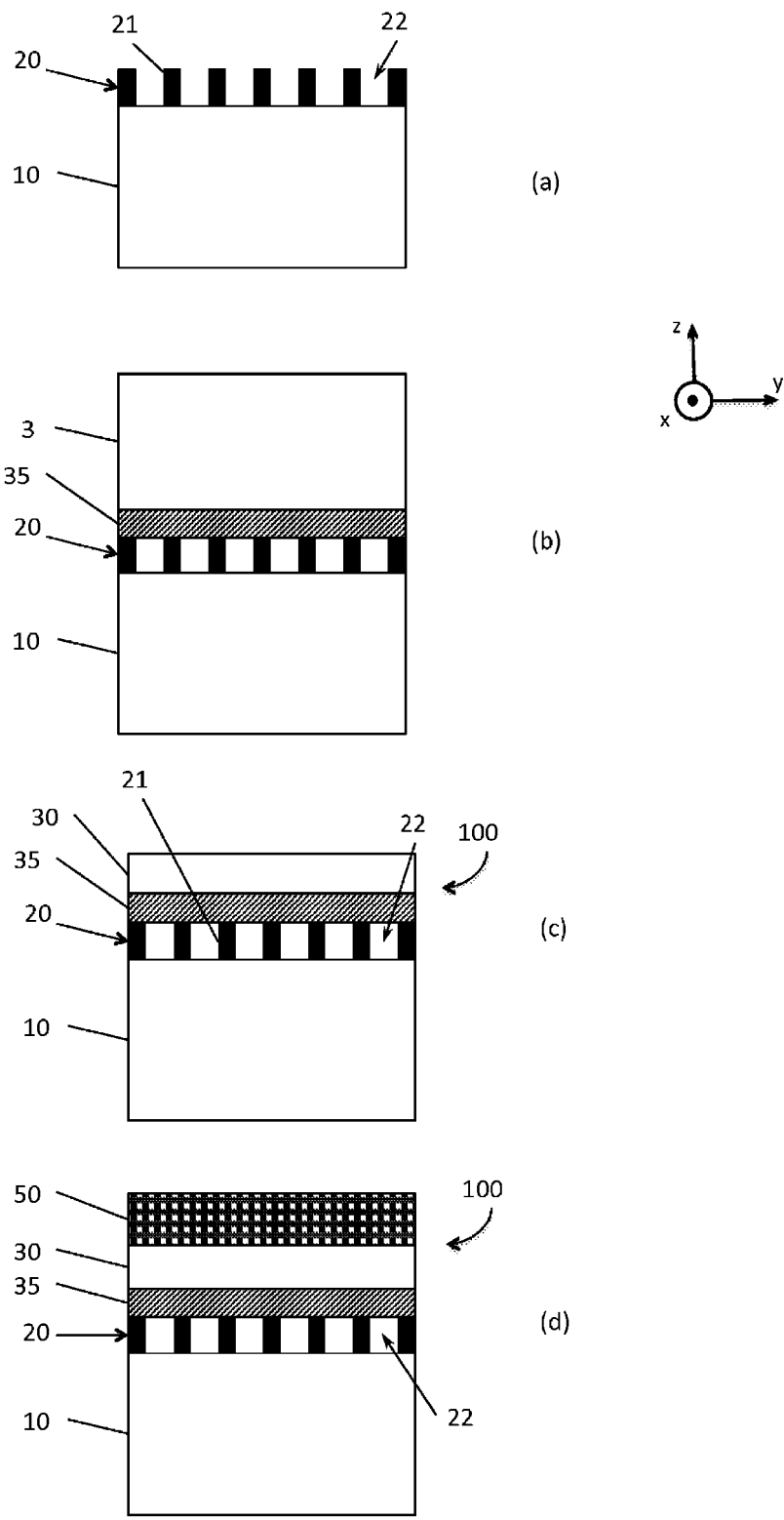
FIG. 6 (a,b,c,d) shows steps of manufacturing a detachable structure in accordance with the invention.

According to one option for manufacturing the superficial layer 30, step a) comprises transferring the superficial layer 30 onto the detachable layer 20 (FIG. 6). This transfer can be carried out by assembling the detachable layer arranged on the support substrate 10 (FIG. 6a) with a donor substrate 3 (FIG. 6b) and by thinning the donor substrate 3 in order to form the superficial layer 30 (FIG. 6c).

The assembly can be carried out by any bonding technique that is compatible with the thermal and chemical treatments contemplated for the finishing of the superficial layer 30. In particular, the assembly can be carried out by direct bonding through molecular adhesion, a technique that is well known in the prior art. Optionally, the donor substrate 3 can comprise an additional layer 35 intended for being directly assembled with the detachable layer 20 (FIG. 6b). The additional layer 35 can, for example, be formed from silicon oxide. Prior to bonding, the surfaces to be assembled can undergo dry treatments (plasma activation, for example) and/or wet treatments (chemical cleaning) in order to improve the quality and the resistance of the interface. The latter is advantageously consolidated by the application of a thermal treatment.

The donor substrate 3 then undergoes a thinning step, at the end of which the superficial layer 30 will be formed (FIG. 6c). This thinning step can be performed using various techniques that are known in the prior art, notably:

- the Smart-Cut® method, particularly suited to the formation of very thin layers (typically with a thickness smaller than or equal to 1 micron): it is based on an implantation of gaseous species in the donor substrate 3, at the face to be assembled of same, prior to the assembly step, in order to form a weakened embedded plane; after assembly, during a fracture step, the donor substrate 3 is separated along the weakened plane, in order to leave only the thin superficial layer 30 attached to the support substrate 10.
- the mechanical-chemical thinning processes, including mechanical lapping, chemical-mechanical polishing and chemical etching, especially suited to the formation of layers with thicknesses of between a few microns and some tens or even hundreds of microns.

Of course, the techniques mentioned above are not exhaustive and other known techniques may be used to thin the donor substrate 3 and finish the superficial layer 30.

It is noted that the distribution of the walls 21 in the main plane (x, y) of the detachable layer 20 may be adapted to the thickness and the rigidity of the transferred superficial layer 30. For a thin superficial layer, care will be taken to reduce the dimensions of the zones 22 between the walls 21 and the spaces 2 between the ends thereof.

The density of the walls 21 is chosen so that the detachable layer 20 ensures good mechanical resistance of the superficial layer 30 during the various treatments (thermal, mechanical or chemical), which will be applied thereto in order to manufacture same. In particular, the walls 21 cover between 2% and 40% of the total surface of the support substrate 10, in the main plane (x, y).

Furthermore, since the detachable layer 20 comprises walls 21 that are spaced apart, the empty zones 22 separating the walls 21 communicate with one another and with the atmosphere outside the detachable structure 100. Based on the hypothesis that the detachable layer 20 is formed over the entire extent of the detachable structure 100, no pressure difference is applied on either side of the superficial layer 30, which promotes the mechanical resistance of the superficial layer 30 during the manufacturing thereof.

According to another manufacturing option, step a) also comprises the production of microelectronic components 50 on the superficial layer 30 (FIG. 6d). The microelectronic components 50 can be passive or active components manufactured by routine manufacturing techniques in the semiconductor industry.

Figure 7:
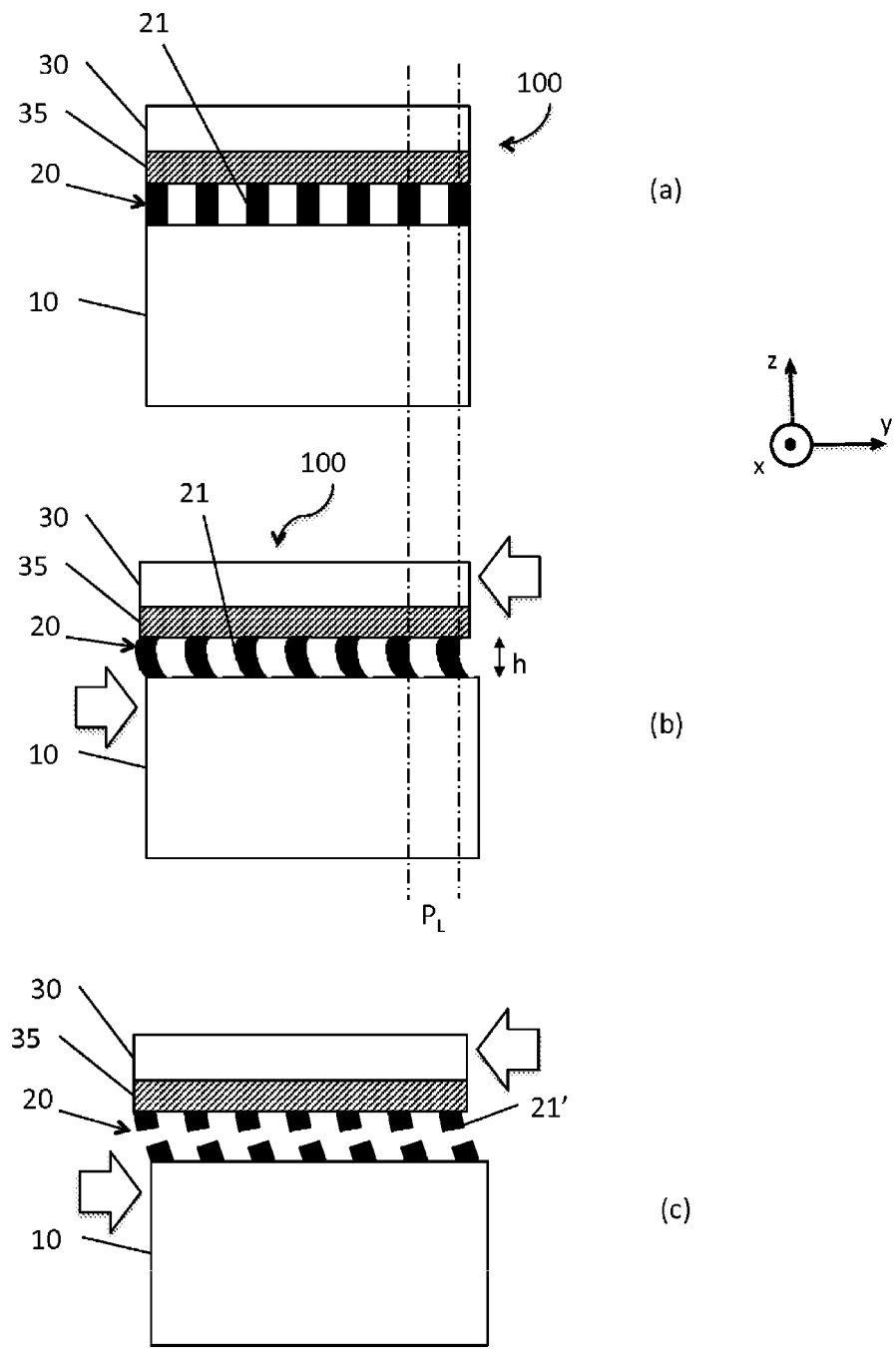
FIGS. 7 (a,b,c), 8 (a,b,c) and 9 (a,b,c) show steps of the transfer method in accordance with the invention.

The transfer method according to the present disclosure secondly comprises a step b) of applying a mechanical force to the detachable structure 100. The mechanical force (depicted by the arrows in FIG. 7b) is configured to cause the walls 21 of the detachable layer 20 (FIG. 7b) to bend, until causing the mechanical rupture thereof (FIG. 7c): this rupture of the walls 21 leads to the detachment of the superficial layer 30 of the support substrate 10.

Bending a wall 21 is understood to be a deformation of at least one part of the side or sides (which extend vertically along the height) of the wall 21. The bending of the wall 21 can thus correspond to a deformation by curving the wall 21 along its height h (simple concave, convex or complex S-shaped curve) or to a deformation by tilting at least one part of the wall 21 out of its original position.

The bending of each wall 21 is carried out along a direction secant to (at least one) side of the wall 21. In the example depicted in FIG. 7, a deformation by curving the walls 21 takes place along the y-axis, one side of the walls 21 being, in original position, parallel to the plane (x, z).

Figure 8:
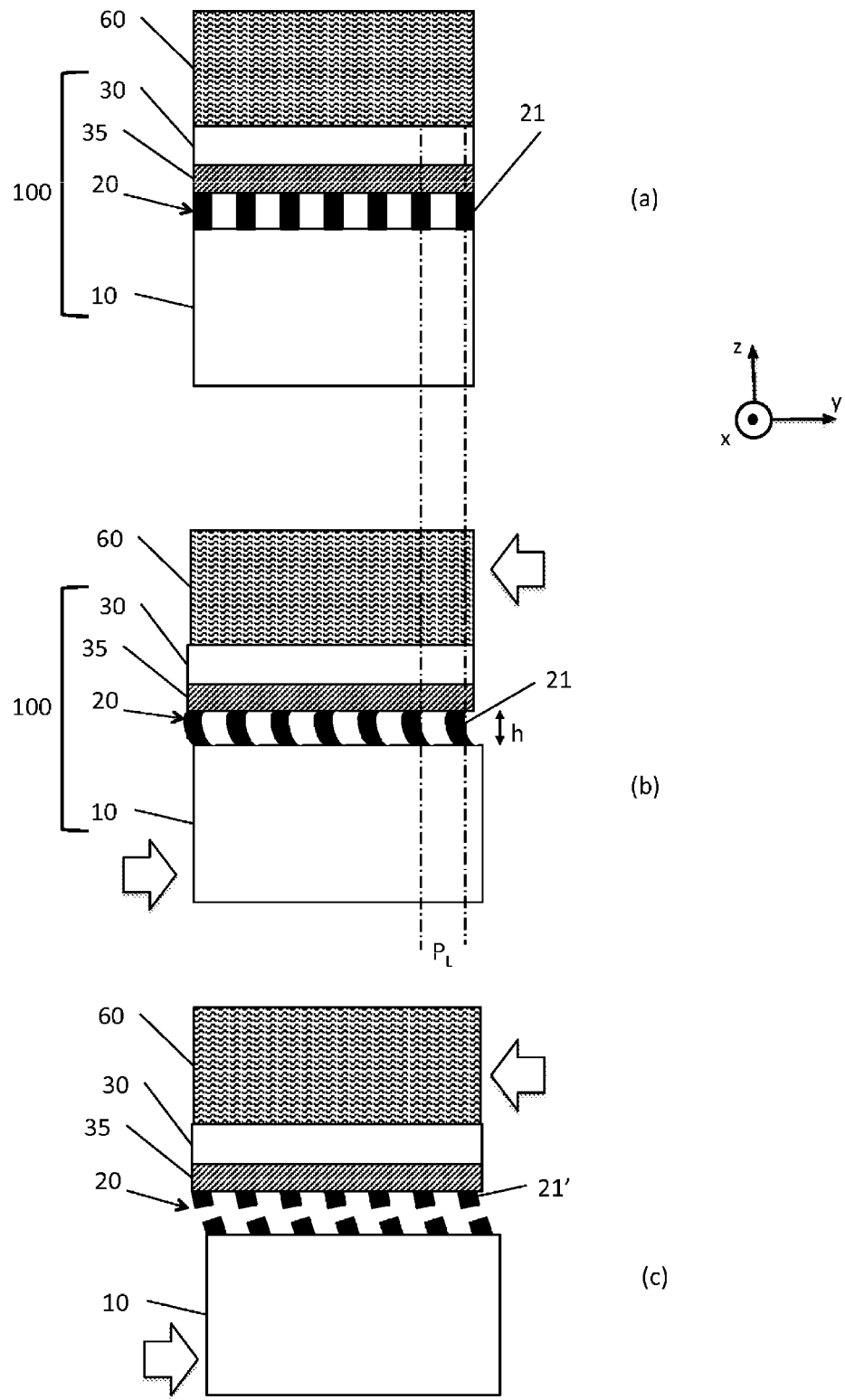

The transfer method according to the present disclosure optionally comprises, prior to step b), a step a') comprising the assembly of the superficial layer 30 on a target substrate 60 (FIG. 8a).

This target substrate 60 can be chosen from all the substrates available in the intended fields of application that are compatible with assembly on the superficial layer 30. The specific features (physical, thermal, electric, etc.) of the target substrate 60 are chosen to improve the performance of the components 50 already manufactured or to be manufactured on the superficial layer 30. At the end of step b) of the transfer method (FIG. 8b), the superficial layer 30 will be detached from the support substrate 10 of the detachable structure 100 and transferred onto the target substrate 60 (FIG. 8c).

For example, in the field of radiofrequency components, it may be valuable to transfer a superficial layer 30 provided with RF components 50 onto a target substrate 60 formed of a highly insulating material such as glass.

In the context of the transfer method according to the invention, the presence of the target substrate 60 forming a mechanical support for the superficial layer 30 can facilitate the application of the mechanical force to the detachable structure 100.

According to a first embodiment of step b) of the transfer method, the ordered grid of walls 21 is such that there is at least one transverse direction $D_T$ in the main plane (x, y) forming a non-zero angle with one side of each wall 21. As shown in FIGS. 2a to 2f, for each predefined grid of walls 21, there is at least one transverse direction $D_T$ in the main plane (x, y), which forms a non-zero angle with the (at least one) side of each wall 21. Even if only one transverse direction $D_T$ has been schematically shown, it is obvious in the figures that other transverse directions $D_T$ exist.

Figure 2A:
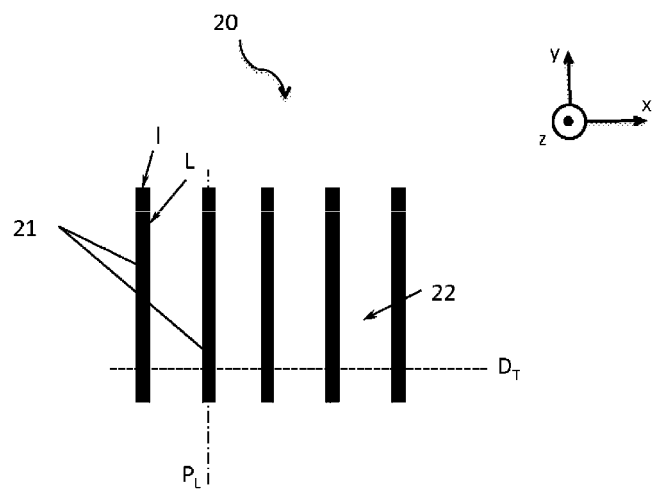
FIGS. 2a to 2f show a planar view (along the XY plane shown schematically in FIG. 1) of various examples of a detachable layer of a detachable structure in accordance with the invention.
Figure 2B:
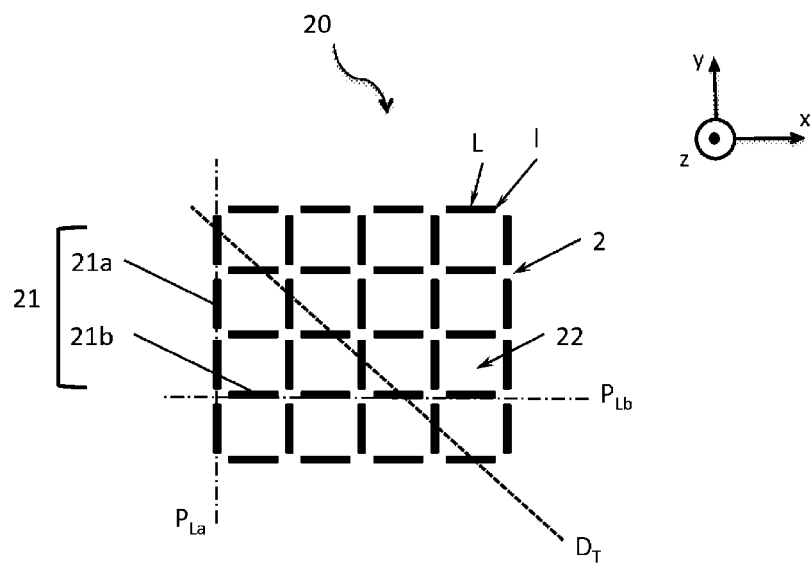
Figure 2C:
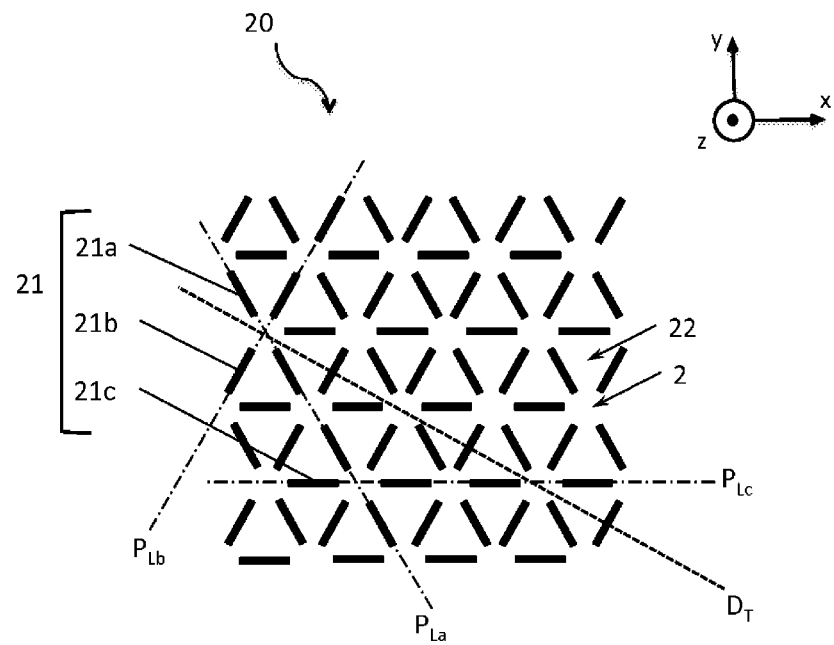
Figure 2D:
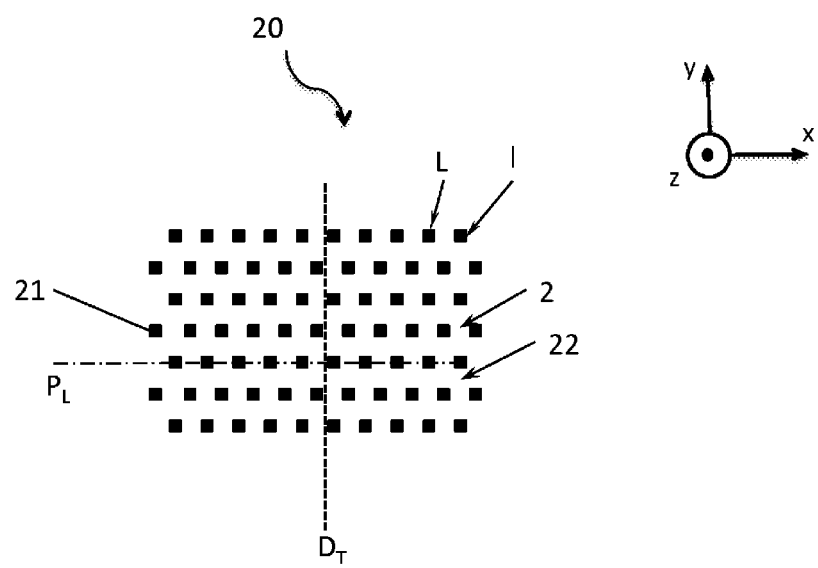
Figure 2E:
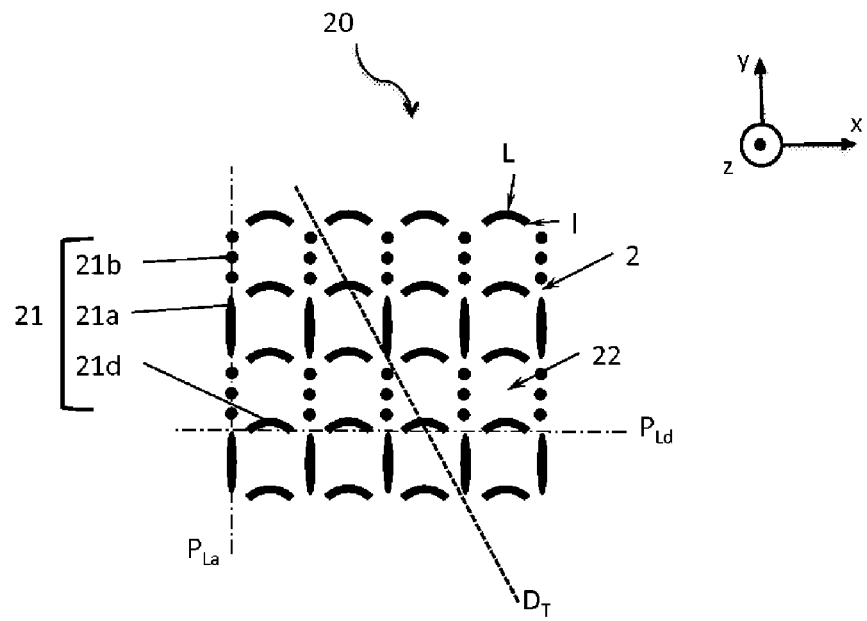
Figure 2F:
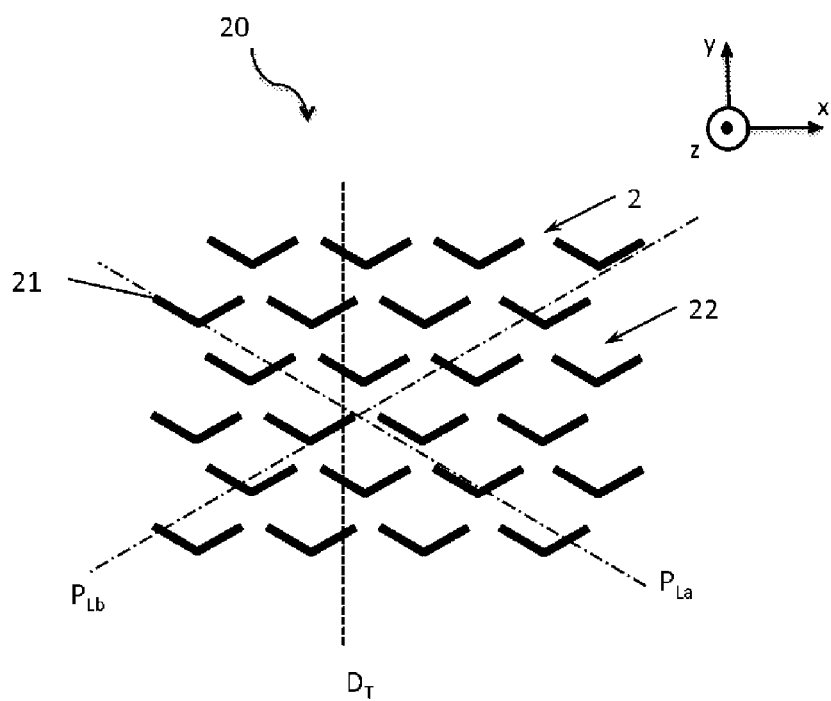

Advantageously, in the case of walls 21, which are longer than they are wide and comprising longitudinal sides, the (at least one) transverse direction $D_T$ is chosen so that it forms a non-zero angle with a longitudinal side of each wall 21. Specifically, the transverse direction $D_T$ forms a non-zero angle with a longitudinal plane $P_L$, $P_{La}$, $L_{Lb}$, $P_{LC}$ wherein a longitudinal side of each wall 21, 21a, 21b, 21c (FIGS. 2a, 2b, 2c, 2d, 2f) extends or with a longitudinal plane $P_{Ld}$ passing through the ends of each wall 21d (FIG. 2e).

In this case, the mechanical force of step b) is advantageously a shearing force applied to the detachable layer 20 along the (or one of the) transverse direction(s) $D_T$.

Indeed, each transverse direction $D_T$ corresponds to a direction of shear weakness of the walls 21: a mechanical shearing force applied to the detachable layer 20 will readily cause each wall 21 to bend. As mentioned before, the bending may result in a deformation by curving of the (preferably longitudinal) sides of the wall 21 or by tilting the wall 21 out of its original position.

Conversely, a mechanical shearing force along a longitudinal direction, i.e., included in a longitudinal plane $P_L$ or coplanar with a longitudinal plane $P_L$, would be very poorly effective in causing the wall 21 to bend: unlike the transverse direction(s) $D_T$, such a longitudinal direction is a direction with greater shear resistance of the detachable layer 20.

The detachable layer 20 can be subjected to a shearing force by applying an overall static force to the detachable structure 100 (force shown schematically in FIGS. 7a and 8a).

By way of example, a tool for gripping the detachable layer 20 or the target substrate 60 when the latter is present, and a tool for gripping the support substrate 10 can each exert a force in the opposite direction, along the chosen transverse direction $D_T$, so as to generate shearing stress at the detachable layer 20. The shearing stress causes the walls 21 to bend until the mechanical rupture thereof.

According to a variant, the detachable layer 20 can be subjected to a shearing force by applying a gradual static force to the detachable structure 100.

In particular, such a gradual static force can be transmitted by means of a roller 5, advancing gradually over the detachable structure 100, in the main plane (x, y) and along the transverse direction $D_T$, with a specific pressing force.

Figure 9:
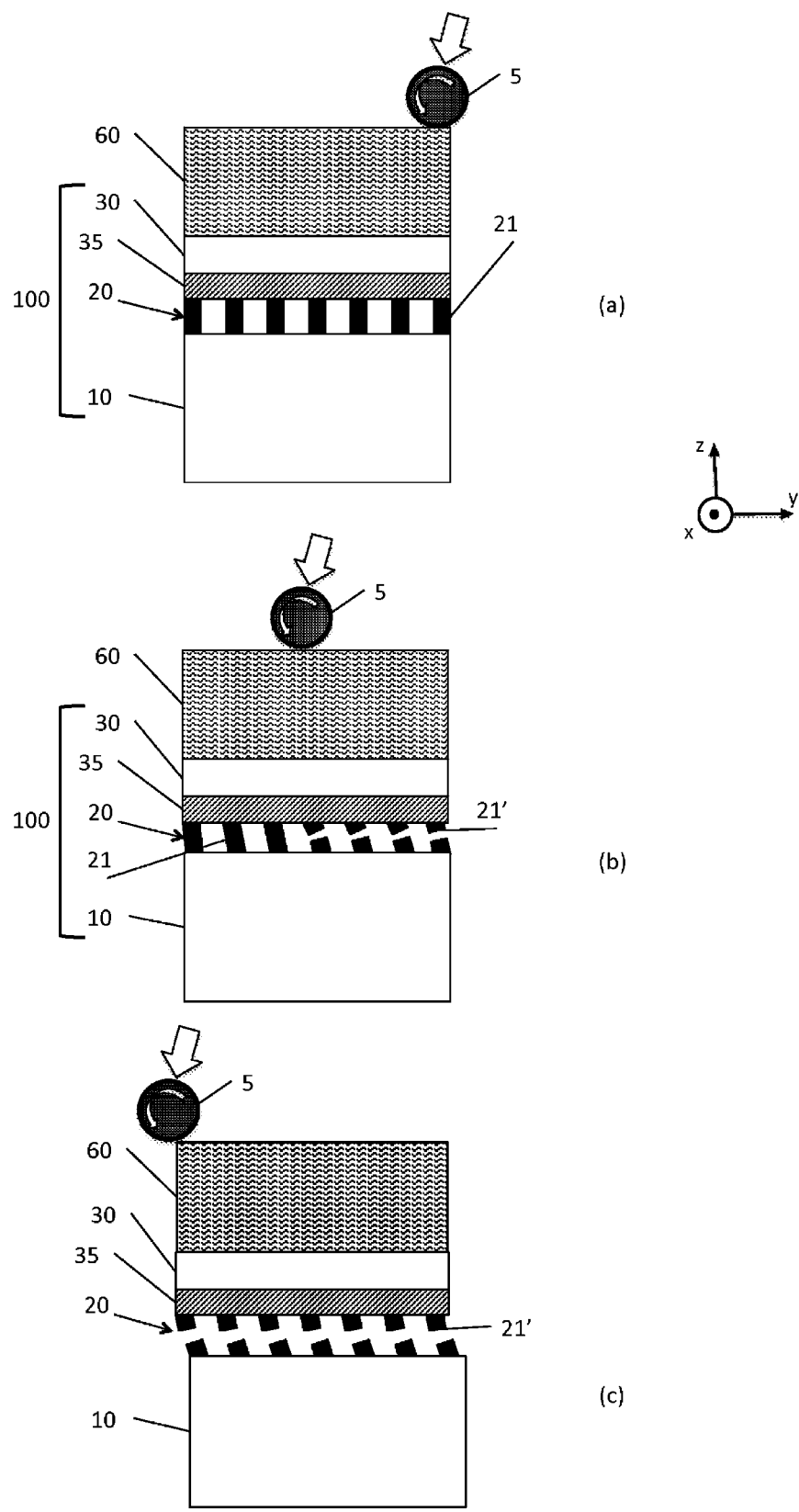

In the example shown in FIG. 9, a roller 5 is pressed against the rear face of the target substrate 60 and advances gradually over the rear face due to the rotation thereof (FIG. 9a). The rear face of the support substrate 10 of the detachable structure 100 is held on a fixed support. The pressing force of the roller 5 causes the walls 21 to tilt or sag as the roller 5 advances. The pressing force is determined so as to cause the rupture of the walls. As shown schematically in FIGS. 9b and 9c, the rupture of the walls 21 takes place gradually in the zones of the detachable layer 20 that are substantially in line with the roller 5, until complete detachment when the walls 21 have given way over the entire extent of the detachable layer 20.

According to another variant, the mechanical force of step b) is a shock applied to the detachable structure 100, along the transverse direction $D_T$.

By way of example, this shock can be applied to one edge of the detachable structure 100 and may consist of a force applied at specific points and in a time-limited manner (mechanical shock). Due to the brief nature of the application of the shock force (of the order of one millisecond), a compression wave, referred to as shock wave, propagates over the extent of the detachable structure 100, causing the walls 21 of the detachable layer 20 to bend as it progresses. The mechanical rupture of the walls 21 will thus occur gradually during the propagation of the shock wave.

In the first embodiment of step b) of the transfer method, according to either one of the previously described variants, an example will be taken of a detachable layer 20 formed in a detachable structure 100 having a total surface area of 100 cm$^2$. The walls 21 have a height of 5 microns, a width of 0.5 microns, a length of 10 cm, and are spaced apart from one another by 20 microns. The detachable layer 20 is thus made up of around five thousand parallelepipedal walls 21. The walls 21 are made of silicon.

With a total force of between 15 and 25 kN over 100 cm$^2$ (i.e., a force applied to each wall 21 of between around 3 and 5 N), a bending deformation of the silicon walls 21 is achieved that is greater than their theoretical resistance to mechanical rupture. In practice, a significantly lower total force may lead to the mechanical rupture of the walls 21 by bending, due to incipient ruptures introduced during the manufacturing of the walls 21 and/or due to the use of asymmetrical walls 21, having narrowings in the lower parts 212 thereof.

According to a second embodiment of step b) of the transfer method, the mechanical force applied to the detachable layer 20 is the result of an oscillation whose movement is mainly located in the main plane (x, y). The vibrating wave is capable of making the walls 21 oscillate.

By way of example, a vibrating plate onto which the support substrate 10 is attached may be used. The oscillating movement of the plate is preferably effected along the transverse direction $D_T$ of weakness of the detachable layer 20.

The oscillation will cause each wall 21 to bend repeatedly: each wall 21 is then subjected to considerable inertial forces, due to the mass of the detachable layer 20 and potentially of the target substrate 60 arranged above the detachable layer 20.

In the context of this second embodiment, regarding the previously cited example of the detachable layer 20: a detachable structure 100 having a total surface area of 100 $cm^2$; silicon walls 21 having a height of 5 microns, a width of 0.5 microns, a length of 10 cm, and spaced apart from one another by 20 microns. A silicon superficial layer 30 with a thickness that varies from 0.1 to 100 microns will be considered.

A vibrating wave imposing an oscillation amplitude of the walls of the order of 1 micron, and of which the frequency is chosen around the resonance frequency, between around 19 MHz (for the superficial layer of 0.1 microns) and around 420 kHz (for the superficial layer of 100 microns), would be capable of generating an inertial force of the order of 3 N applied to each wall 21. As mentioned before, with such a force, a deformation of the silicon walls 21 is achieved that is greater than their theoretical resistance to mechanical rupture.

Thus, in the first or second embodiment of step b) of the transfer method, the mechanical force configured to cause the walls 21 to bend has a reasonable amplitude due to the specific characteristics of the detachable layer 20. This is favorable for maintaining the integrity of the superficial layer 30 during the transfer process and, in particular, during the detachment thereof from the support substrate 10. Moreover, since the mechanical force applied to the detachable structure 100 has no (or little) traction component (along the z-axis in the figures), there is less risk of damaging the superficial layer 30 during the transfer. Furthermore, the total force of the mechanical forces, mainly shearing, needed to detach the superficial layer 30, is much smaller than the force for stripping by traction that would need to be applied in order to separate the superficial layer 30.

Advantageously, the transfer method according to the present disclosure comprises, after detaching the superficial layer 30 in step b), a step c) that includes removing remainders 21' of detachable layer 20 (FIGS. 7c, 8c, 9c). The removal of the remainders 21' of the detachable layer can consist, in particular, of etching the remainders 21' followed by cleaning in order to expose a detached face of the superficial layer 30. This detached face is either directly a surface of the superficial layer 30, or a surface of the additional layer 35 introduced when transferring the superficial layer 30 onto the detachable layer 20 so as to form the detachable structure 100.

Advantageously, step c) also comprises the removal of the remainders of detachable layer 20 that remain on the support substrate 10. The latter can thus be reused to form a new detachable structure 100.

Step c) optionally comprises the performance of microelectronic steps on the detached face of the superficial layer 30.

These steps can consist of:
producing all or part of the components on the detached face of the superficial layer 30 (either directly on the free surface of the superficial layer 30, or on the free surface of the additional layer 35);
or producing all or part of the components on the detached face of the superficial layer 30, facing components 50 that are already present on the opposite face of the superficial layer 30, in order to produce, for example, double-gate CMOS transistors;
or even restoring electrical contacts on the detached face of the superficial layer 30, connected to components 50 already present on the other surface of the superficial layer 30.

Generally speaking, the present transfer method can cover a large number of applications that require the transfer or handling of superficial layers 30.

The superficial layers 30 can be transferred or handled in the form of large layers, i.e., with the dimensions of a wafer, for example, circular with a diameter of 100 mm to 450 mm.

Local superficial layers 30 included in a total superficial layer can likewise be transferred or handled individually, in the form of chips; the chips having, for example, side dimensions from several hundred microns to several millimeters.

In this case, step a) of supplying the detachable structure 100 comprising the total superficial layer (and potentially components 50) comprises a cutting step for delimiting each local superficial layer 30 to be transferred. The cutting paths extend over the entire thickness of the superficial layer and advantageously cut into or pass completely through the detachable layer 20. The cutting paths can optionally likewise cut into the support substrate 10.

During step b), the mechanical force is applied to at least one local superficial layer 30. It is thus possible to locally detach individual chips (local zones of the total superficial layer) from the detachable structure 100.

For example, in the case of a mechanical force in the form of a vibrating wave, it is possible to apply a load to the local superficial layer (chip) to be detached; the local application of a load may be carried out by adding a defined mass, by depositing a specific layer or by mechanical pressing at specific points. A vibration at a frequency corresponding to the resonance frequency of the walls 21 underlying the local superficial layer (said resonance frequency depending on the mass of the layers above the walls 21) will make it possible for the walls 21 underlying the local superficial layer to oscillate until their rupture. It is thus possible to individually detach the chips from the detachable structure 100.

Of course, the invention is not limited to the described embodiments and variant embodiments can be provided thereto without departing from the scope of the invention as defined by the claims.

The invention claimed is:

1. A method for transferring a superficial layer from a detachable structure, comprising the following steps:
    a) supplying a detachable structure comprising:
        a support substrate,
        a detachable layer arranged on the support substrate along a main plane and comprising a plurality of walls that are separated from one another, each wall having at least one side perpendicular to the main plane;

a superficial layer arranged on the detachable layer along the main plane; and b) applying a mechanical force configured to cause said walls to bend, along a direction that is secant to the at least one side, until causing the mechanical rupture of the walls, in order to detach the superficial layer from the support substrate; and wherein step a) comprises transferring the superficial layer onto the detachable layer by assembling a donor substrate on the detachable layer and by thinning the donor substrate in order to form the superficial layer.

2. The method of claim 1, wherein the walls are distributed in the main plane according to a predefined grid.

3. The method of claim 2, wherein the predefined grid of walls is such that there is at least one transverse direction in the main plane forming a non-zero angle with one side of each wall.

4. The method of claim 3, wherein each wall comprises two longitudinal sides defined by a length and a height of the wall, and two transverse sides defined by a width and the height of the wall, the longitudinal and transverse sides being perpendicular to the main plane.

5. The method of claim 4, wherein the length of each wall is greater than the width of each wall, and wherein the transverse direction forms a non-zero angle with a longitudinal side of each wall.

6. The transfer method according to claim 3, wherein the mechanical force of step b) is a shearing force applied to the detachable layer along the transverse direction.

7. The method of claim 6, wherein the shearing force is applied by a roller, advancing gradually over the detachable structure, in the main plane and along the transverse direction, with a pressing force.

8. The transfer method according to claim 3, wherein the mechanical force of step b) is a shock applied to the detachable structure, along the transverse direction.

9. The transfer method according to claim 3, wherein the mechanical force of step b) is a vibrating wave applied to the detachable structure, along the transverse direction, and capable of making the walls oscillate.

10. The transfer method according to claim 1, wherein each wall has a width, in the main plane, of between 0.1 and 10 microns.

11. The transfer method according to claim 1, wherein a width of each wall at the lower part in the vicinity of the support substrate is smaller than a width of each wall at the upper part in the vicinity of the superficial layer.

12. The transfer method according to claim 1, wherein the walls have a height, perpendicular to the main plane, of between 0.5 and 5 microns.

13. The transfer method according to claim 1, wherein each wall has a width in the main plane and a height perpendicular to the main plane and wherein the height-to-width ratio is greater than 1.

14. The transfer method according to claim 1, wherein the detachable layer of the detachable structure supplied in step a) is formed by local etching of a layer of silicon oxide arranged on the support substrate.

15. The transfer method according to claim 1, wherein the detachable layer of the detachable structure supplied in step a) is formed by local etching of the support substrate.

16. The transfer method according to claim 1, wherein step a) comprises the production of microelectronic components on the superficial layer.

17. The transfer method according to claim 1, further comprising, prior to step b), a step of cutting the superficial layer in order to delimit a plurality of local superficial layers to be transferred.

18. The transfer method according to claim 13, wherein each wall has a width in the main plane and a height perpendicular to the main plane and wherein the height-to-width ratio is greater than 5.

* * * * *

UNITED STATES PATENT AND TRADEMARK OFFICE
CERTIFICATE OF CORRECTION

Page 1 of 1

PATENT NO. : 11,222,824 B2
APPLICATION NO. : 16/769976
DATED : January 11, 2022
INVENTOR(S) : Michel Bruel It is certified that error appears in the above-identified patent and that said Letters Patent is hereby corrected as shown below:

In the Specification

| | | |
|---|---|---|
| Column 4, | Line 28, | change "the width 1" to --the width l-- |
| Column 4, | Line 30, | change "1 of each" to --l of each-- |
| Column 4, | Line 62, | change "(ME)) or" to --(RIE)) or-- |

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*